United States Patent
Maier et al.

(10) Patent No.: US 11,031,929 B1
(45) Date of Patent: Jun. 8, 2021

(54) ACTIVELY TRACKING SWITCHING SPEED CONTROL OF A POWER TRANSISTOR

(71) Applicant: Infineon Technologies AG, Neubiberg (DE)

(72) Inventors: Robert Maier, Bayreuth (DE); Mark-Matthias Bakran, Erlangen (DE); Daniel Domes, Ruethen (DE); Zheming Li, Bayreuth (DE); Franz-Josef Niedernostheide, Hagen am Teutoburger Wald (DE)

(73) Assignee: Infineon Technologies AG

( * ) Notice: Subject to any disclaimer, the term of this patent is extended or adjusted under 35 U.S.C. 154(b) by 0 days.

(21) Appl. No.: 16/943,318

(22) Filed: Jul. 30, 2020

(51) Int. Cl.
  *H03K 17/042* (2006.01)
  *H03K 17/687* (2006.01)
  *H03K 17/95* (2006.01)

(52) U.S. Cl.
  CPC ..... *H03K 17/04206* (2013.01); *H03K 17/687* (2013.01); *H03K 17/951* (2013.01)

(58) Field of Classification Search
  CPC ................ H03K 17/04206; H03K 17/687

USPC ......... 327/108, 109, 110, 111, 374, 376, 377
See application file for complete search history.

(56) References Cited

U.S. PATENT DOCUMENTS

| | | | |
|---|---|---|---|
| 2009/0116265 A1* | 5/2009 | Saji | H02M 3/33507 363/37 |
| 2020/0177090 A1* | 6/2020 | Braz | H02M 3/33592 |

\* cited by examiner

*Primary Examiner* — William Hernandez
(74) *Attorney, Agent, or Firm* — Design IP

(57) ABSTRACT

A method of driving a transistor includes generating an off-current during a plurality of turn-off switching events to control a gate voltage at a gate terminal of the transistor, wherein generating the off-current includes sinking a first portion of the off-current from the gate terminal to discharge a first portion of the gate voltage, and sinking, during a boost interval, a second portion of the off-current from the gate terminal to discharge a second portion of the gate voltage; measuring a transistor parameter indicative of an oscillation of a drain-source voltage of the transistor for a first turn-off switching event during which the transistor is transitioned off; activating the first portion of the off-current for a second turn-off switching event; and activating the second portion of the off-current for the second turn-off switching event, including regulating a length of the boost interval based on the measured transistor parameter.

28 Claims, 6 Drawing Sheets

ACTIVELY TRACKING SWITCHING SPEED CONTROL OF A POWER TRANSISTOR

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state.

A power transistor is a power semiconductor device that may be used to drive a load current. There is a turn-on process and a turn-off process for switching the power transistor on and off. During the turn-on process, a gate driver integrated circuit (IC) is used to provide (source) a gate current to the gate of the power transistor in order to charge the gate. In contrast, during the turn-off process, the gate driver IC is used to draw (sink) a gate current from the gate of the power transistor in order to discharge the gate and thus lower the gate voltage.

During the transition from the conductive to the blocking operation of the power transistor, the so-called switching process, both blocking voltage on the power transistor and current flow through the power transistor simultaneously exist for a short time. This leads to the inevitable switching losses. With the aim of highly efficient switching and ever higher switching frequencies, it is necessary to reduce the switching losses of the power transistor.

The switching behavior of the power transistor is set by the control at the control electrode. Simple controls work with voltage-controlled components with two voltage levels and a series resistor. This results in a uniform control behavior which is constant across all operation point vectors of the power transistor. These operation point vectors depend on the following parameters: VDC, iD, the junction temperature of the power transistor, and the gate driver voltage applied to the gate. However, due to the large operating range in which the power transistor is operated, especially for silicon carbide (SiC) transistors, this results in a control which does not behave optimally for a wide operating range (i.e., for a wide range of operation point vectors). One of the trade-offs that this behavior poses is between the tendency to oscillate when switching fast, especially of unipolar components, and high energy loss when switching the same component slowly. In addition to the tendency to oscillate, there is also the risk of an electrical overload of the power transistor due to switching too quickly. For the electrical overload, a clear switching speed limit can be defined from the technical description of the manufacturer. Due to the large operating range, this limit cannot be optimally exploited for every operation point vector with a simple control in order to reach the optimal point of the conflict of objectives.

The oscillation is considered undesirable in terms of electromagnetic compatibility or electromagnetic interference. However, it is not easy to set a clear switching speed limit. This switching speed limit value always depends on the soldering environment. Also, with regard to the tendency to oscillate, "simple control" means that the switching process cannot be optimally set for each operation point vector.

In order to optimize the switching process of modern power electronic switches, including SiC transistors, control devices with two-stage or multi-stage switching speeds are often used. This more complex control can improve the conflict of objectives mentioned above.

The necessary setting of a time duration or a temporal portion of the respective switching speed is strongly dependent on the operation point vector. As a result of this dependency, a control or regulation should be used that sets the corresponding time duration or temporal portion of a switching stage implemented by the control device for a respective operation point vector of the power transistor. Therefore, an improved device that enables regulation of a time duration or a temporal portion of a switching stage for each operation point of the power transistor may be desirable.

SUMMARY

Embodiments further provide a gate driver system configured to drive a transistor between switching states in a power circuit. The gate driver system includes a gate driver circuit coupled to a gate terminal of the transistor and configured to control a gate voltage at the gate terminal in order to drive the transistor between the switching states, the gate driver circuit configured to generate an off-current during a plurality of turn-off switching events to turn off the transistor, wherein the gate driver circuit includes a first driver configured to sink a first portion of the off-current from the gate terminal to discharge a first portion of the gate voltage, wherein the gate driver circuit includes a second driver configured to, during a boost interval, sink a second portion of the off-current from the gate terminal to discharge a second portion of the gate voltage; a measurement circuit configured to measure a transistor parameter indicative of an oscillation of a drain-source voltage of the transistor for a first turn-off switching event during which the transistor is transitioned to an off state; and a controller configured to control the first driver to sink the first portion of the off-current and to control the second driver to sink the second portion of the off-current, wherein the controller is further configured to receive the time derivative of the drain current and regulate a length of the boost interval based on the measured transistor parameter.

Embodiments provide a method of driving a transistor between switching states in a power circuit. The method includes generating an off-current during a plurality of turn-off switching events to control a gate voltage at a gate terminal of the transistor, wherein generating the off-current includes sinking a first portion of the off-current from the gate terminal to discharge a first portion of the gate voltage, and sinking, during a boost interval, a second portion of the off-current from the gate terminal to discharge a second portion of the gate voltage; measuring a transistor parameter indicative of an oscillation of a drain-source voltage of the transistor for a first turn-off switching event during which the transistor is transitioned to an off state; activating the first portion of the off-current for a second turn-off switching event; and activating the second portion of the off-current for the second turn-off switching event, including regulating a length of the boost interval based on the measured transistor parameter.

BRIEF DESCRIPTION OF THE DRAWINGS

Embodiments are described herein making reference to the appended drawings.

DETAILED DESCRIPTION

Figure 1:
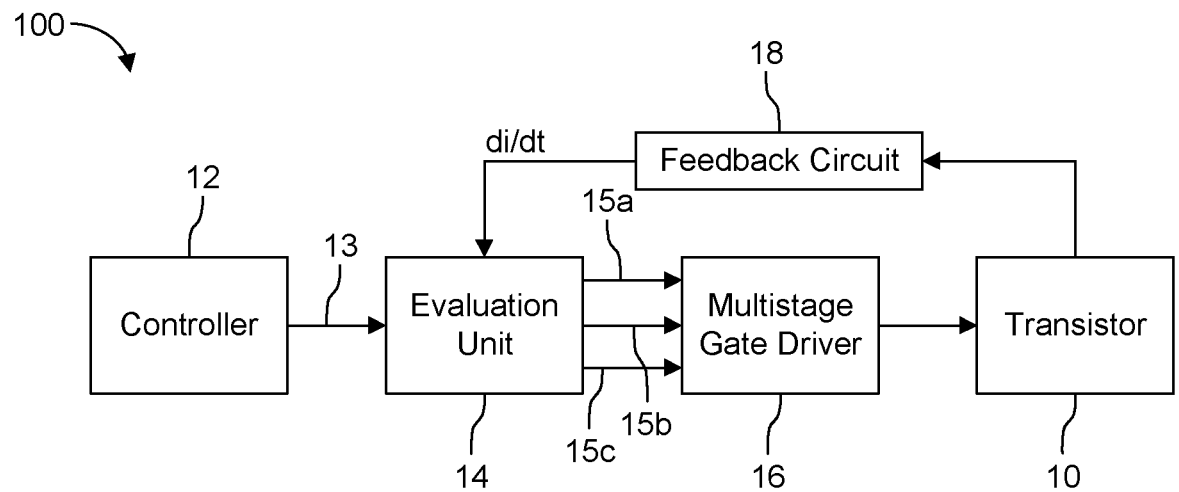
FIG. 1 is a schematic block diagram of a gate driver system with slew-rate control (SRC) according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate voltage sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches approximately 0V. During a turn ON event, after some small amount of time (small compared to the PWM period), the gate current decreases and reaches a zero value when the gate reaches the high side supply level.

Transistors may include Insulated Gate Bipolar Transistors (IGBTs) and Metal Oxide Semiconductor Field Effect Transistors (MOSFETs) (e.g., Si MOSFETs or SiC MOSFETs). It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementarily to the each other for driving a phase load.

FIG. 1 is a schematic block diagram of a gate driver system 100 with slew-rate control (SRC) according to one or more embodiments. The gate driver system 100 includes a power transistor 10, control circuitry, and gate driver circuitry that implements a scheme for SRC of the power transistor 10 during turn-on and turn-off. In particular, different switching speeds, and thus different slew-rates, can be implemented for both turn-on and turn-off of the power transistor 10 (i.e., during a switching transition).

The gate driver system 100 includes a controller 12, an evaluation unit 14, a multistage gate driver 16, the transistor 10, and a feedback circuit 18. The controller 12 may be a microcontroller that generates a control signal 13 for controlling a switching state of the transistor 10. For example, the control signal 13 may be a pulse-width modulation (PWM) control signal that provides switch-on and switch-off commands to the evaluation unit 14. Alternatively, the control signal 13 may represent one of two separate control signals, including one switch-on control signal and one switch-off control signal.

A multilevel control signal of three or more levels may allow for different levels (e.g., speed stages or speed levels) of switch-on or switch-off to be implemented. For example, a multilevel control signal with four possible levels (e.g., voltage levels) may be able to indicate two different turn-off switching speed stages and two different turn-on switching speed stages. Similarly, if two separate control signals are used for turn-on and turn-off control, each may be implemented as a multilevel control signal where each level corresponds to a different switching speed stage. For example, a multilevel switch-off command having two possible levels may be used to indicate two different turn-off switching speed stages. Thus, one of two different turn-off switching speed stages may be activated according to the control signal 13. It will also be appreciated that three or more speed stages may be used for both turn-on and turn-off.

The evaluation unit 14 is configured to receive the control signal 13 and control the multistage gate diver 16 based thereon. In one example, the evaluation unit 14 may be an FPGA. In particular, the evaluation unit 14 may activate or deactivate one or more switching speed stages for turn-on and/or turn-off based on the control signal 13. In addition, the evaluation unit 14 further receives feedback information (i.e., di/dt) and further controls a duration or temporal portion of one or more of the turn-off switching speed stages. Thus, the evaluation unit 14 controls a timing or one or more turn-off switching speed stages based on the control signal 13.

A turn-on switching stage provides an ON current (i.e., current Io+) to the control terminal (i.e., the gate terminal) of the power transistor 10. One or more turn-on switching speed stages may be activated to regulate the ON current, and thus, regulate the turn-on switching speed and slew rate of the power transistor 10. Here, the slew rate is the slope of the drain-source voltage $V_{DS}$ of the power transistor.

For example, the slew rate control for turn-on may be divided into two main intervals: a boost-on interval and a turn-on interval. A different constant current is maintained for each interval. Similarly, the slew rate control technique uses a boost-off interval and a turn-off interval. The boost-on interval and the boost-off interval may generally be referred to as boost intervals, whereas the turn-on interval and the turn-off interval may generally be referred to as switching state intervals.

The boost-on current loads the gate terminal of a power transistor so that the gate voltage is sufficient to turn on the transistor 10. Alternatively, the boost-on current may be a preboost-on current that loads the gate terminal of a power transistor so that the gate voltage is close, but still below the gate threshold voltage needed to turn on the transistor. This is realized by applying a gate current amplitude (i.e., a boost level) for the boost-on interval. Thus, the gate terminal is charged to a turn-on voltage for boost or precharged to a pre-turn-on voltage for preboost.

The turn-on current level may be applied during the second interval (i.e., the turn-on interval). The amplitude of the turn-on current is often lower than the boost-on current amplitude but is sufficient to turn on the transistor and/or keep the transistor turned on. Whether or not a boost-on current for accelerated turn-on switching is used may be indicated by the control signal 13.

In contrast, a turn-off switching stage sinks an off current (i.e., current Io−) from the control terminal (i.e., the gate terminal) of the power transistor 10. One or more turn-off switching speed stages may be activated to regulate the off current and the gate voltage, and thus, regulate the turn-off switching speed and slew rate of the power transistor.

In particular, a boost-off current may discharge the gate terminal so that the gate voltage is sufficient to turn off the transistor 10. Alternatively, the boost-off current may be a preboost-off current that discharges the gate terminal of a power transistor so that the gate voltage is close, but still above the gate threshold voltage so that the transistor is still on. Subsequently, the turn-off current level is applied during the turn-off interval in order to turn off the transistor. The amplitude of the turn-off current is often lower than the boost-off current amplitude but is sufficient to turn off the transistor and/or keep the transistor turned off. Whether or not a boost-off current for accelerated turn-off switching is used may be indicated by the control signal 13.

The turn-off process of power transistors is often dominated by a longer turn-off propagation delay time. The propagation delay is dominating the dimensioning of the dead time in half-bridge configurations. Since no energy is transferred to the load of power electronic converters, it is a target to reduce the dead time as much as possible. An individual and automated adjustment of the turn-off process, and particularly the boost-off duration $T_B$ or a temporal component thereof, according to the operation point vector of the power transistor 10 is desired in order to achieve the optimal performance of the power transistor. The boost-off duration $T_B$ may be referred to as an acceleration duration, a boost duration, a boost time, or a boost interval.

The evaluation unit 14 is configured to determine whether a boost-off current is used and which turn-off switching stage is to be activated for the boost stage based on the control signal 13. In addition, the feedback information (i.e., di/dt) is representative of the real-time operation point vector of the transistor 10. The evaluation unit 14 uses the feedback information (i.e., di/dt) to determine a time duration or temporal portion for a boost stage ($T_B$), and thus, for the activated turn-off switching stage. In addition, it is possible that two or more turn-off switching stages may be used. The two or more turn-off stages may be activated and deactivated synchronously, activated synchronously and deactivated asynchronously, or activated and deactivated asynchronously. For example, two turn-off stages may be activated at the same time and deactivated sequentially based on different deactivation times. Furthermore, each turn-off stage may be activated for a same duration or for different durations.

The multistage gate driver 16 includes multiple control stages for turn-on and turn-off of the transistor 10. As explained above, different turn-on and turn-off switching stages may be used to control how quickly the transistor 10 turns on and off. Thus, each switching stage corresponds to a different switching speed that regulates the slew rate of the transistor 10 during a switching event (i.e., during a turn-on or turn-off transient).

The feedback circuit 18 is configured to measure a characteristic of the power transistor 10 in order to derive the time derivative of the switching current (i.e., load current) of the transistor 10. Thus, the feedback circuit 18 measures the feedback information (i.e., di/dt), where the switching current is the drain current $I_D$. Thus, the time derivative of the switching current may also be referred to as a time derivative switching current $di_D/dt$. As will be described below, the time derivative of the switching current may be derived from measuring a voltage across a stray inductance included in the load path and coupled in series to the power transistor 10.

Figure 2A:
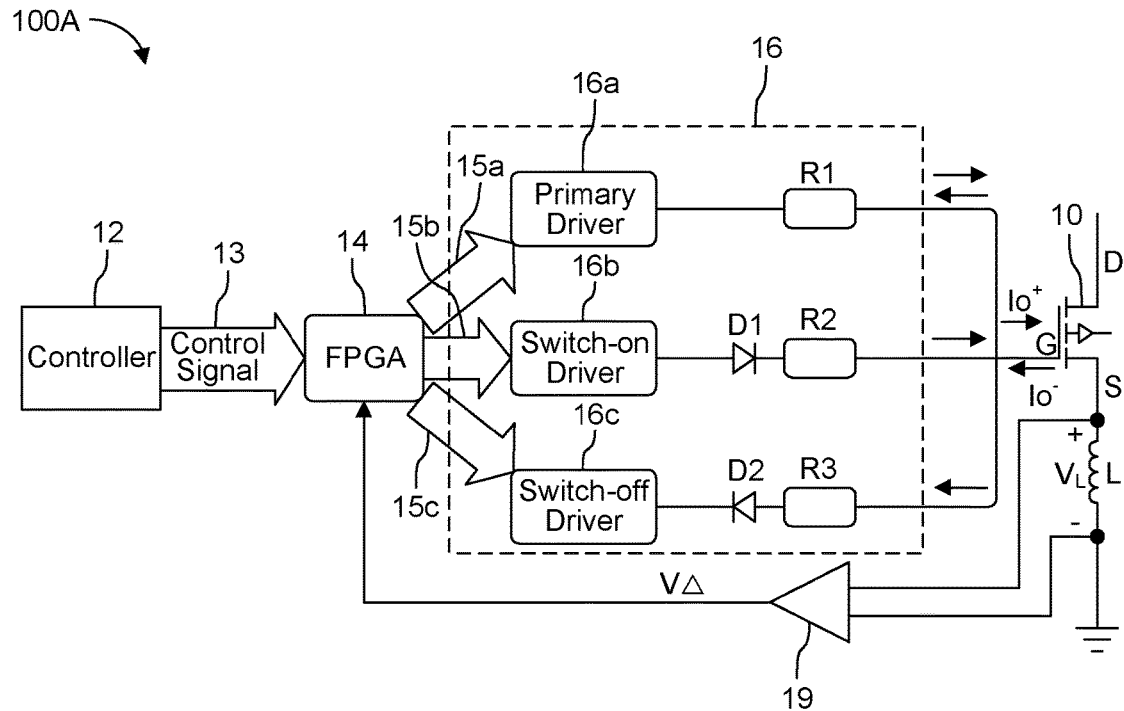
FIG. 2A is a schematic diagram of the gate driver system with a measurement circuit according to one or more embodiments.
Figure 2B:
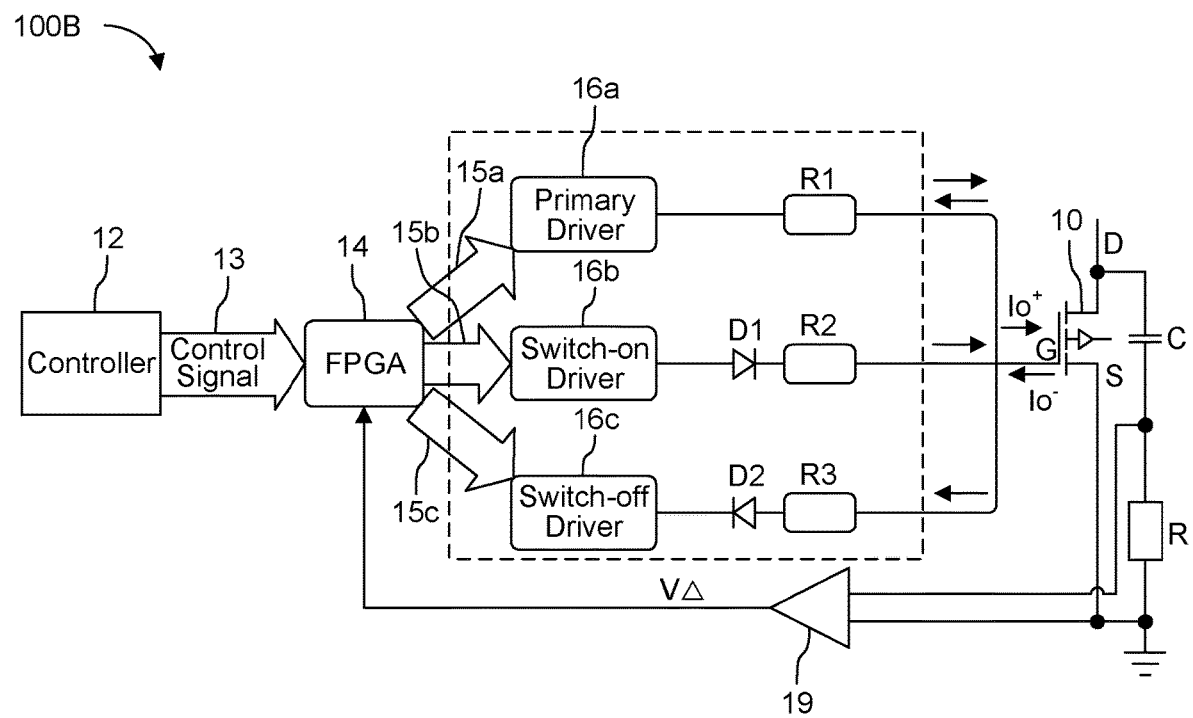
FIG. 2B is a schematic diagram of the gate driver system with another measurement circuit according to one or more embodiments.
Figure 2C:
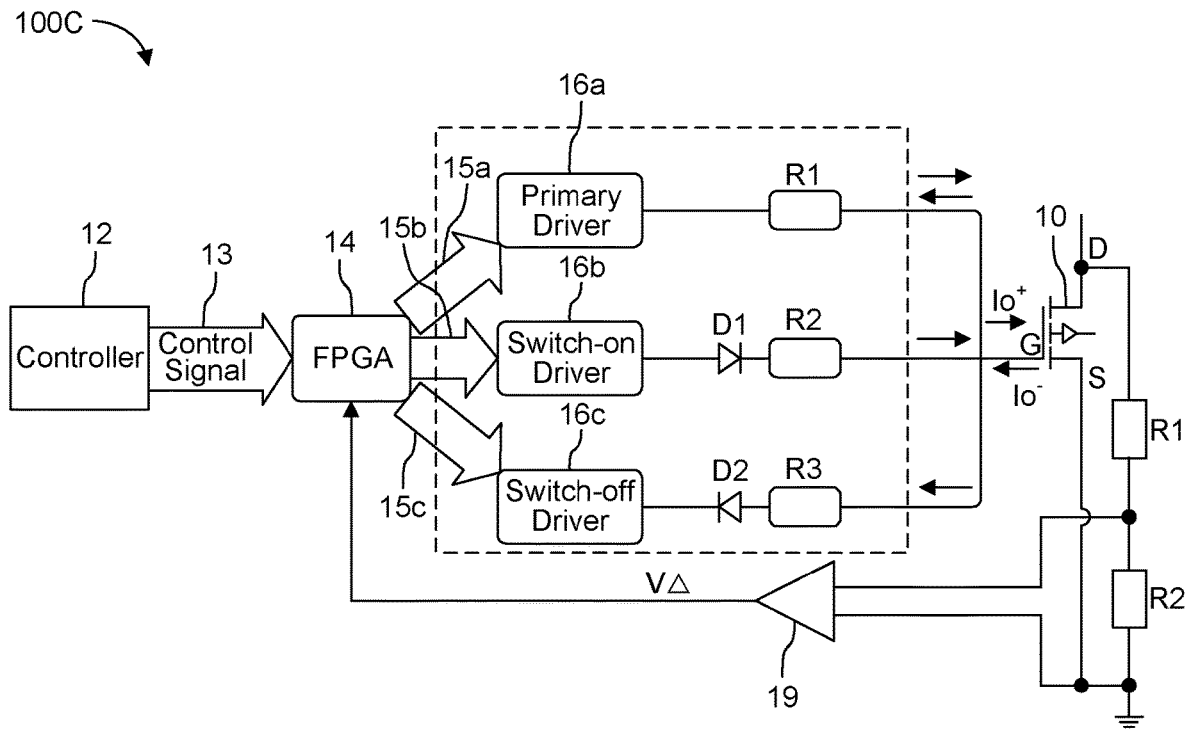
FIG. 2C is a schematic diagram of the gate driver system with another measurement circuit according to one or more embodiments.
Figure 2D:
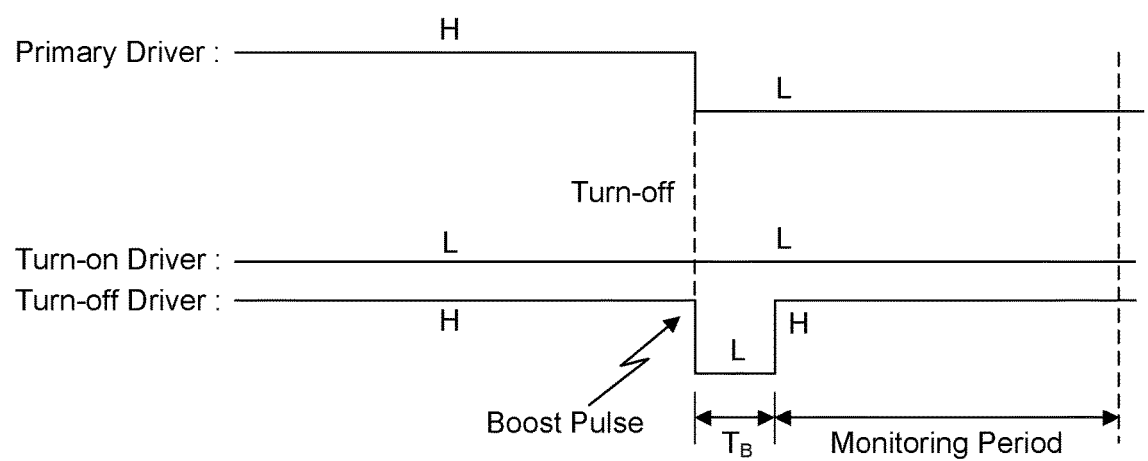
FIG. 2D is a waveform diagram of a control voltages generated by the drivers of the multistage gate driver during turn-off of a power transistor according to one or more embodiments.

FIG. 2A is a schematic diagram of the gate driver system 100A including a measurement circuit according to one or more embodiments. FIG. 2B is a schematic diagram of the gate driver system 100 including another type of measurement circuit according to one or more embodiments. FIG. 2C is a schematic diagram of the gate driver system 100C including another type of measurement circuit according to one or more embodiments. FIG. 2D is a waveform diagram of a control voltages generated by the drivers of the multistage gate driver 16 during turn-off of the power transistor 10 according to one or more embodiments.

The multistage gate driver 16 of the present example is illustrated using the example of a two-stage control for turn-off. The two turn-off stages are implemented by two separately controllable series resistors R1 and R3. Similarly, two turn-on stages are implemented by two separately controllable series resistors R1 and R2.

In general, the gate driver system 100 measures a time derivative of the switching current $di_D/dt$ and compares the time derivative switching current $di_D/dt$ with a trigger threshold (e.g., an overshoot threshold) to determine a comparison result. Based on the comparison result, the gate driver system 100 adapts a duration $T_B$ or a temporal portion of an accelerated turn-off stage during which the accelerated turn-off stage is activated, thereby adapting its respective switching speed.

The multistage gate driver 16 includes a primary driver 16a configured to control a turn-on and turn-off of the power transistor 10. The multistage gate driver 16 further includes a switch-on driver 16b configured to accelerate or boost the turn-on time of the transistor 10. Thus, the switch-on driver 16b supplements the turn-on function of the primary driver 16a by implementing a faster switching speed than the primary driver 16a. The multistage gate driver 16 further includes a switch-off driver 16c configured to accelerate or boost the turn-off time of the transistor 10. Thus, the switch-off driver 16c supplements the turn-off function of the primary driver 16a by implementing a faster switching speed than the primary driver 16a.

The control signal 13 for changing the switching state of the transistor 10 is processed by the evaluation unit 14. The evaluation unit 14 may be a fast FPGA or other gate driver controller that controls the gate driver stages of the multistage gate driver 16. The evaluation unit 14 generates driver control signals 15a, 15b, 15c that control one of the respective drivers 16a, 16b, and 16c. Thus, the turn-on and turn-off functionally for transistor 10 driven by the drivers 16a, 16b, and 16c can be activated and deactivated according to these control signals 15a, 15b, and 15c. Each of the drivers 16a, 16b, and 16c is configured to generate a low (negative) control voltage or high (positive) control voltage based on their respective driver control signals 15a, 15b, 15c to control the flow of gate current at the power transistor 10.

The primary driver 16a is electrically coupled to very large series resistor R1 and controls slow switching of the transistor 10. This series resistor R1 should be selected at least so large that the switching process fulfills the conflict of objectives at every operation point vector of the planned operating range. The series resistor R1 with a high value must therefore ensure that a switching process meets oscillation criterion/criterial for all operation point vectors. The oscillation criterion/criteria may mean that the drain-source voltage $V_{DS}$ of the transistor 10, the drain current $i_D$ of the transistor 10, and/or a time derivative of the drain current $di_D/dt$ of the transistor 10 has no oscillation, has substantially no oscillation, or has oscillation that is within a tolerance limit that does not exceed an overvoltage or overshoot threshold for $V_{DS}$ of the transistor 10. For example, oscillation criterion/criteria may result in a 90% reduction of the oscillation amplitude (peak to peak).

The turn-on driver 16b is electrically coupled to a directional diode D1 and a series resistor R2 and controls a faster turn-on switching of the transistor 10. The directional diode D1 allows current to flow to the gate or the transistor 10 but blocks current in the opposite direction. Here, the resistance value of the series resistor R2 may be selected to according to the switching speed provided by the turn-on driver 16b. In general, the series resistor R2 enables a higher gate current Io+ to flow to the gate of the transistor 10, resulting in accelerated gate charging and shorter turn-on times.

The turn-off driver 16c is electrically coupled to a directional diode D2 and a series resistor R3 and controls a faster turn-off switching of the transistor 10. The directional diode D2 allows current to sink from the gate or the transistor 10 but blocks current in the opposite direction. Here, the resistance value of the series resistor R3 may be selected to according to the switching speed provided by the turn-off driver 16b. In general, the series resistor R3 enables a higher gate current Io− to be drawn from the gate of the transistor 10, resulting in accelerated gate discharging and shorter turn-off times.

To optimize the conflict of objectives, the switch-off driver 16c is briefly switched on during the switch-off process. While switched on, the switch-ff driver 16c generates a boost pulse at its output (i.e., a pulse of a low (negative) control voltage). This leads to an acceleration of the switch-off process, since switching is accelerated by the lower resistance. In particular, the evaluation unit 14 switches to a low (negative) control voltage via control signals 15a and 15c for the primary driver 16a and for the turn-off driver 16c. As a result of the two drivers 15a and 15c generating a low (negative) control voltage, both the primary driver 16a and the turn-off driver 16c sink gate current from the transistor 10 to turn off the transistor 10. Since the turn-on driver 16b is only used for a turn-on boost, its control voltage is already at a low level and the turn-on driver 16b does not participate in the turn-off process. The primary driver 16a maintains this low (negative) voltage level to sink gate current and/or maintain the transistor 10 in the off state until the control signal 13 initiates a turn-on switching event.

A boost duration $T_B$ is determined by the evaluation unit 14. Once the boost duration $T_B$ of the switching acceleration has lapsed, the evaluation unit 14 switches the turn-off driver 16c to a high (positive) control voltage via control signal 15c, ending the boost pulse according to the controlled boost duration $T_B$. Once the control voltage at the turn-off driver 16c is switched positive, the directional diode D3 becomes reverse-biased and prevents further current flow (sink) to the turn-off driver 16c, so that it no longer participates in the turn-off switching process. In other words, the turn-off switching process is braked to the speed of the control of the primary driver 16a once the turn-off driver 16c is deactivated. If the evaluation unit 14 has set the boost duration $T_B$ of the acceleration correctly according to the operation point vector of the transistor 10, a fast switching process can be achieved that meets oscillation criterion (i.e., has no oscillation, has substantially no oscillation, or has oscillation that is within a tolerance limit that does not exceed an overvoltage or an overshoot threshold for $V_{DS}$ of the transistor 10). On the other hand, if oscillation in the switching current is detected by the evaluation unit 14, the evaluation unit 14 can adjust to the acceleration duration $T_B$ such that the oscillation criterion is satisfied at a subsequent turn-off switching event.

Thus, after the turn-off switching process, the evaluation unit 14 evaluates the time derivative switching current $di_D/dt$ against oscillation criterion. In order to obtain the time derivative switching current $di_D/dt$, a comparator 19 implemented as part of the feedback circuit 18 measures a voltage drop VΔ. In FIG. 2A, the comparator 19 measures a voltage drop VΔ across a stray inductance L that is coupled in series with the transistor 10 along its load path. In particular, the stray inductance L is coupled to a load path terminal of the transistor 10, such as the source terminal. The stray inductance L may be, for example, a wire (e.g., bond wire or printed circuit board conductor line) that acts as a stray inductor.

The comparator 19 receives the two voltage values measured across the stray inductance L and generates a comparator output signal that represents the instantaneous voltage difference or voltage drop VΔ across the stray inductance L. The evaluation unit 14 receives the instantaneous voltage drop VΔ across the stray inductance L, and calculates the instantaneous rate of current change $di_D/dt$ (amps per second) based on the instantaneous voltage drop VΔ and the known, pre-stored value of the stray inductance L. Thus, the feedback circuit 18 shown in FIG. 1 includes the stray inductance L, the comparator 19, and part of the evaluation unit 14 (i.e., a processing circuit) used for determining the time derivative switching current $di_D/dt$.

The evaluation unit 14 then evaluates the time derivative switching current $di_D/dt$ against oscillation criterion. However, depending on the clock frequency of the application, it may not be time-critical. For example, with a high switching frequency of 40 kHz of the power transistor 10, the evaluation must be done within 25 s and with lower clock frequencies the time available increases accordingly). Based on the evaluation, the evaluation unit 14 regulates the duration $T_B$ of the switching acceleration (i.e., the amount of time the turn-off driver 16c is activated or the amount of time the turn-off driver 16c generates a negative control voltage at the cathode of the directional diode D3 before switching back to a positive control voltage at the cathode).

This regulation of the duration $T_B$ of the switching acceleration includes maintaining a current duration setting if the time derivative switching current $di_D/dt$ meets the oscillation criterion or adjusting (e.g., decreasing) the duration setting if the time derivative switching current $di_D/dt$ does not meet or exceeds the oscillation criterion. In addition, the evaluation unit 14 may adjust the duration setting by increasing the duration if the time derivative switching current $di_D/dt$ meets the oscillation criterion. In this way, by incrementally increasing the duration setting if the oscillation criterion is met and incrementally decreasing the duration setting if the oscillation criterion is not met, an upper limit to the duration setting can be found based on a measurement of the operation point vector taken in real-time.

In FIG. 2B, the feedback circuit 18 includes a capacitor C and a series resistor R circuit that is coupled in parallel to the transistor 10. Here, the comparator 19 implemented as part of the feedback circuit 18 measures a voltage drop VΔ across the resistor R. The voltage drop VΔ is then used by the evaluation unit 14 in a similar manner described above.

In FIG. 2C, the feedback circuit 18 includes a voltage divider comprising resistor R1 and R2. The voltage divider is coupled in parallel to the transistor 10. Here, the comparator 19 implemented as part of the feedback circuit 18 measures a voltage drop VΔ across the resistor R2. The voltage drop VΔ is then used by the evaluation unit 14 in a similar manner described above.

Figure 3A:
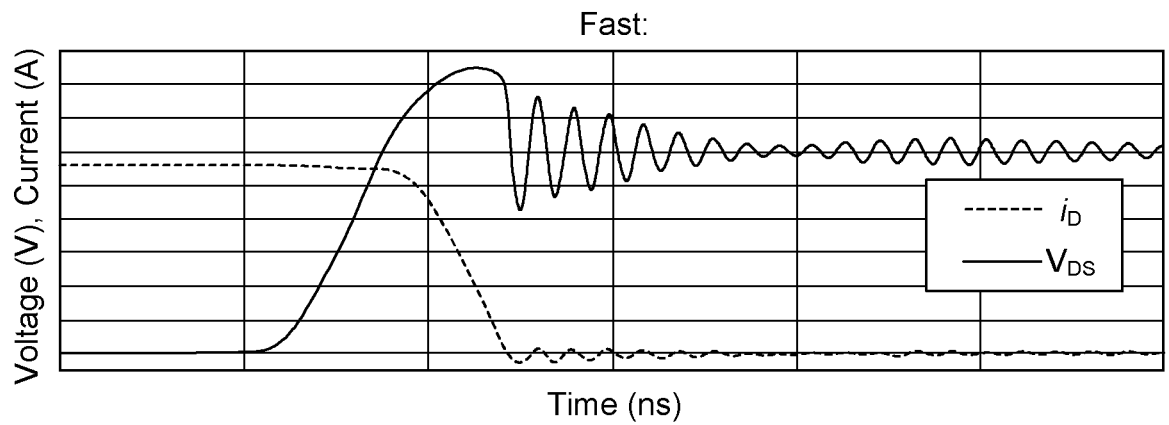
FIG. 3A shows normalized waveforms of the drain-source voltage $V_{DS}$ and drain current $i_D$ using fast switching for turn-off of a power transistor without regulating a switching acceleration duration based on a measured operation point vector.

FIG. 3A shows normalized waveforms of the drain-source voltage $V_{DS}$ and drain current $i_D$ using fast switching for turn-off of the power transistor 10 without regulating a switching acceleration duration based on a measured operation point vector. Here, the switching process is pure-ohmic switching with low switching loss is used. Thus, the switching process is fast and makes optimal use of the electrical capabilities of the power transistor 10, but leads to a large oscillation.

Figure 3B:
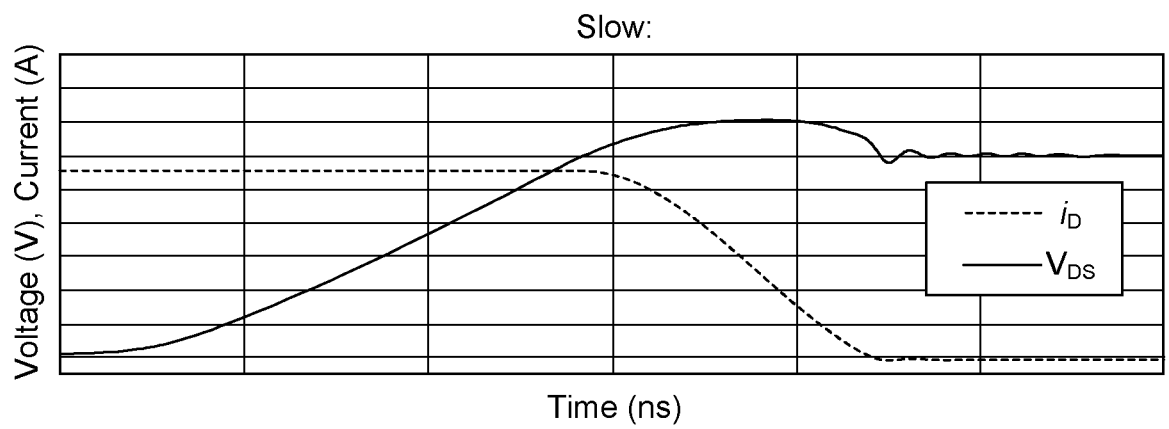
FIG. 3B shows normalized waveforms of the drain-source voltage $V_{DS}$ and drain current $i_D$ using slow switching for turn-off of a power transistor without regulating a switching acceleration duration based on a measured operation point vector.

FIG. 3B shows normalized waveforms of the drain-source voltage $V_{DS}$ and drain current $i_D$ using slow switching for turn-off of the power transistor 10 without regulating a switching acceleration duration based on a measured operation point vector. Here, the switching process is pure-ohmic switching with a small oscillation but has a higher switching loss.

Thus, FIGS. 3A and 3B illustrate the fundamental conflict of objectives with regard to oscillation. This conflict of objectives is improved by optimizing the two-stage gate driver control by using a turn-off boost procedure with an adjusted acceleration duration or boost duration $T_B$ that is regulated based on an evaluation of the time derivative of the switching current $di_D/dt$. Using this turn-off switching technique, a fast switching process that satisfies predetermined oscillation criterion with low switching loss can be achieved.

Figure 4:
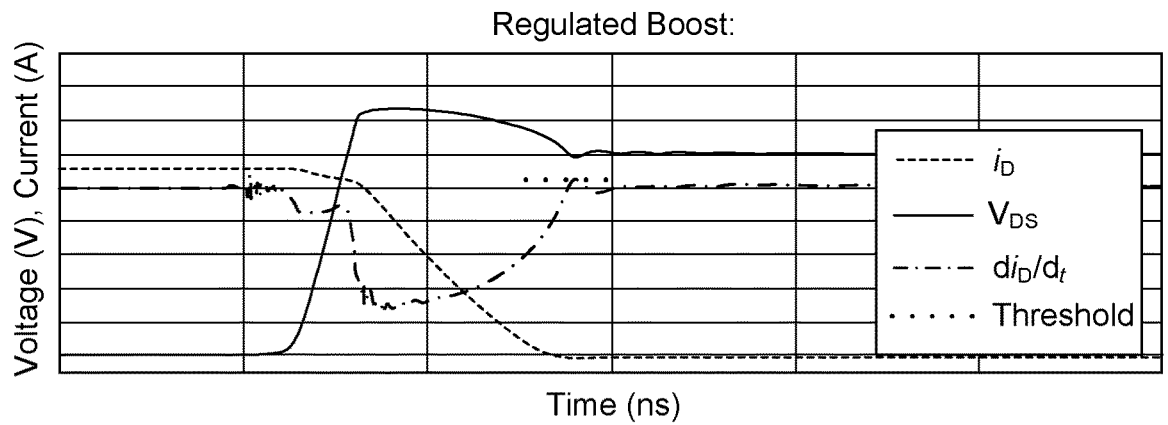
FIG. 4 is directed to a turn-off switching event and illustrates normalized waveforms of the drain-source voltage $V_{DS}$, drain current $i_D$, and time derivative switching current $di_D/dt$ of a power transistor using fast switching and a regulated acceleration duration $T_B$ according to one or more embodiments.

FIG. 4 is directed to a turn-off switching event and illustrates normalized waveforms of the drain-source voltage $V_{DS}$, drain current $i_D$, and time derivative switching current $di_D/dt$ of the power transistor 10 using fast switching and a regulated acceleration duration $T_B$ according to one or more embodiments. In particular, the time derivative switching current $di_D/dt$ is evaluated by the evaluation unit 14 against a threshold limit to regulate the acceleration duration $T_B$ implemented by the turn-off driver 16c. As can be seen, the slopes of the drain-source voltage $V_{DS}$ and the drain current $i_D$ are steep, much like the slopes shown in FIG. 3A, indicating fast turn-off switching of the power transistor 10. At the same time, the oscillations of both the drain-source voltage $V_{DS}$ and the drain current $i_D$ are minimized. The threshold limit is a boundary that if exceeded by the time derivative switching current $di_D/dt$ results in the occurrence of unacceptable oscillation. Thus, the threshold limit sets the oscillation criterion for the evaluation.

Therefore, it can be surmised that FIG. 4 illustrates a benefit of setting the duration $T_B$ of the switching acceleration depending on the operation point vector. A non-optimal boost duration $T_B$ results in either increased oscillation or a significantly slower switching speed.

The evaluation unit 14 is configured to evaluate the time derivative switching current $di_D/dt$ after (e.g., immediately after) a boost pulse of the turn-off driver 16c (i.e., after the boost time $T_B$), but prior to the next boost pulse. For example, the evaluation unit 14 may detect an end of the boost time $T_B$ of a boost pulse and initiate an evaluation of the time derivative switching current $di_D/dt$ in response thereto. The tracked method evaluates the time derivative switching current $di_D/dt$ against the threshold limit of the conflicting target values discussed above. The evaluation unit 14 uses the results of the evaluation to regulate the boost time $T_B$ for the next boost pulse corresponding to the next turn-off switching event of the transistor 10. By doing so, the evaluation unit 14 aims to reduce the oscillation of both the drain-source voltage $V_{DS}$ and the drain current drain-current $i_D$ of the power transistor 10.

Figure 5A:
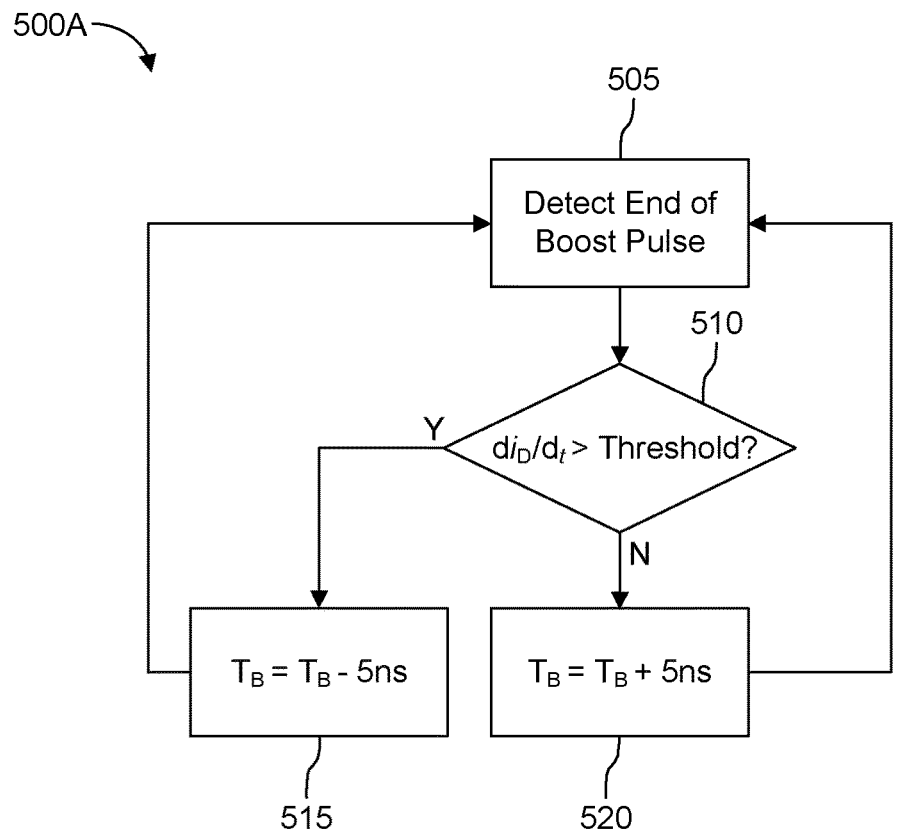
FIG. 5A is a flow diagram for a method of regulating a turn-off boost time $T_B$ according to one or more embodiments.
Figure 5B:
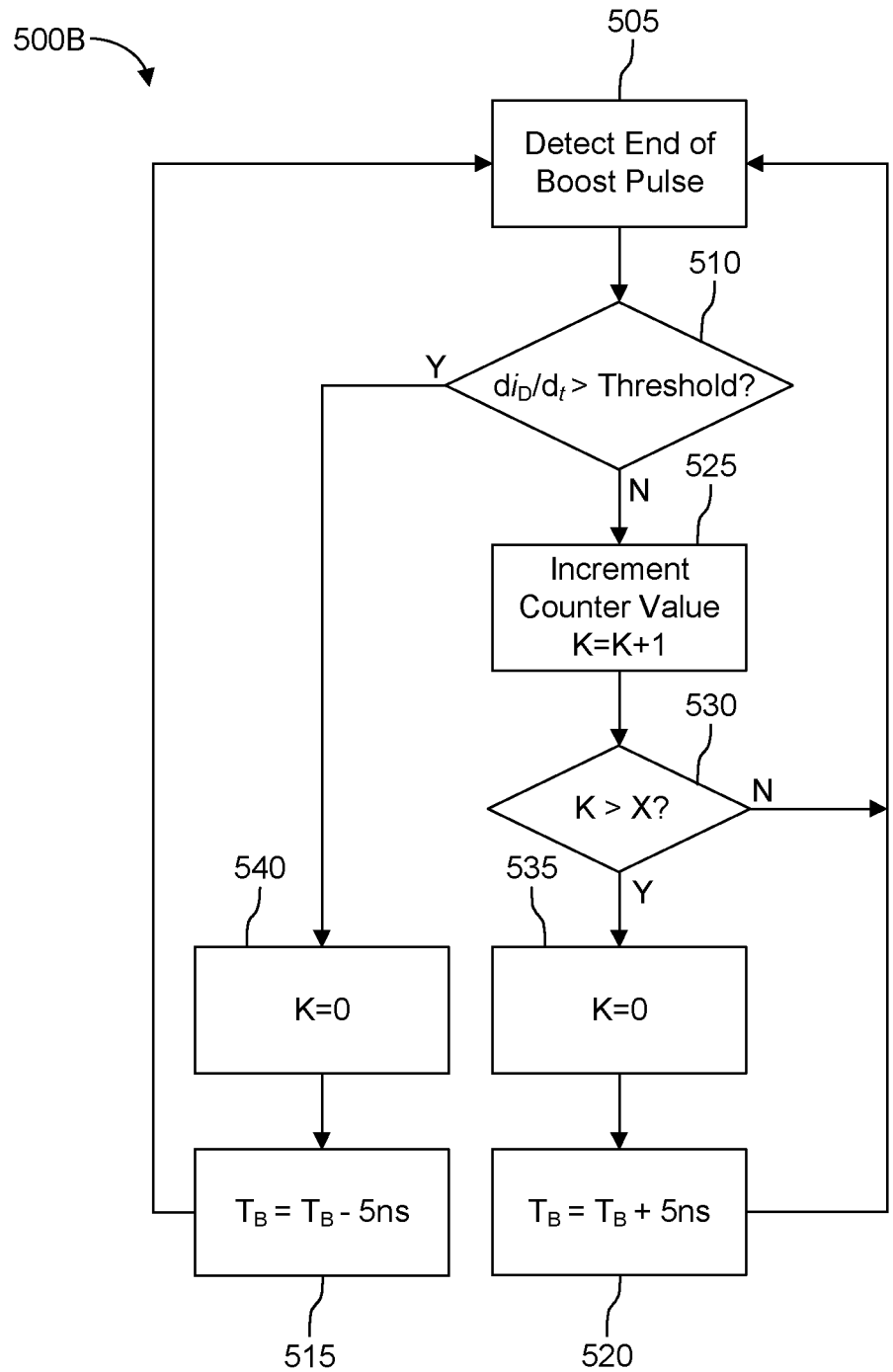
FIG. 5B is a flow diagram for a modified method of regulating a turn-off boost time $T_B$ according to one or more embodiments.

FIG. 5A is a flow diagram for a method 500A of regulating a turn-off boost time $T_B$ according to one or more embodiments. FIG. 5B is a flow diagram for a modified method 500B of regulating a turn-off boost time $T_B$ according to one or more embodiments. Increasing the boost time $T_B$ also increases the tendency for oscillation. Conversely, decreasing the boost time $T_B$ decreases the tendency for oscillation.

It is noted that, if oscillation or a ringing-effect in the drain-source voltage $V_{DS}$ and drain current drain-current $i_D$ exists, the oscillation typically starts after the boost-phase is over and after the drain-current $i_D$ becomes zero. Thus, the end of the boost pulse can be used by the evaluation unit 14 to trigger the monitoring phase for detecting and/or measuring any oscillation that may be present. Upon detecting an oscillation that does not meet the oscillation criterion, further action by the evaluation unit 14 can be taken.

In operation 505, the evaluation unit 14 detects that a boost time $T_B$ of a boost pulse has lapsed. Upon detecting the end of the boost time $T_B$, the evaluation unit 14 measures and evaluates the time derivative switching current $di_D/dt$ (operation 510). In particular, in operation 510, the evaluation unit 14 measures the time derivative switching current $di_D/dt$ and compares it to a predetermined threshold limit. This measurement and comparing operation is preformed over a predetermined monitoring period, as shown in FIG. 2D. The predetermined monitoring period is after the boost pulse and is long enough in duration to detect an oscillation, should it be present. At the end of the monitoring period, if no oscillation has been detected, the evaluation unit 14 can arrive at a "no oscillation" decision. Thus, the predetermined monitoring period provides an acceptable margin for the evaluation unit 14 to determine whether or not oscillation has occurred.

During the predetermined monitoring period, the evaluation unit 14 compares the time derivative switching current $di_D/dt$ to the predetermined threshold limit. If the time derivative switching current $di_D/dt$ exceeds the predetermined threshold limit (Y), the boost time $T_B$ of the switching acceleration for the next turn-off switching operation is reduced by a first adaptation time of a first predetermined amount (operation 515). For example, the boost time $T_B$ is decreased in this example by 5 ns. On the other hand, if the time derivative switching current $di_D/dt$ does not exceed the predetermined threshold limit (N), the boost time $T_B$ of the switching acceleration for the next turn-off switching operation is increased by a second adaptation time of a second predetermined amount (operation 520). For example, the boost time $T_B$ is increased in this example by 5 ns. It will be appreciated that the first predetermined amount and the first predetermined amount may be equal or different amounts. Additionally, a higher adaptation time is conceivable, as is a reduced one. After operation 515 or 520, the evaluation unit 14 waits for the next boost pulse and the method repeats. Thus, the boost time $T_B$ may be adjusted after each boost pulse and dynamically regulated according to the real-time operation point vector.

However, since the setting is always based on the switching process that took place previously, the set duration of the switching acceleration is not necessarily the ideal value. The set duration fluctuates much more within a tolerance band around the setpoint of the boost time $T_B$. This setpoint should therefore be set so that the criteria of the conflicting target values are met within the resulting tolerance band.

A property of the method is the ability to be able to follow every change in the setpoint and thus the operation point vector. If this is not the case, a high rate of change of a parameter and thus a high rate of change of the target value could lead to the criteria of the target value conflict being exceeded.

If the traceability of the setpoint is not achieved due to a high rate of change in the operating conditions in the application or a low update rate for the duration of the switching acceleration due to a low clock frequency, a modification of the method 500A can be used. In particular, an additional operations 525, 530, and 535 may be included between operations 510 and 520 in the modified method 500B. The modification is explained using an example of a high fundamental frequency of the drain current $i_D$ (i.e., a high rate of change of the parameter switching current).

In the event that method 500A cannot track the parameter change of the switching current $i_D$, an optimal switching condition cannot be guaranteed for this parameter. For the other parameters, which change sufficiently slowly in the scenario to ensure traceability, an adjustment of the set boost time $T_B$ of the switching acceleration can nevertheless be achieved.

Operations 525, 530, and 535 ensures that an optimal setting for boost time $T_B$ is still guaranteed for slowly changing parameters. In contrast to the normal implementation, not exceeding the threshold limit (operation 510(N)), the method proceeds to operation 525, which does not directly increase the boost time $T_B$ of the switching acceleration. Instead, in operation 525 a counter value K is incremented by one to a value K+1 (K=K+1). In operation 530, the incremented counter value is compared to a counter threshold X (e.g., X=100). If the incremented counter value does not exceed the counter threshold X (N), the process returns to operation 505 to wait for the next boost pulse. On the other hand, if the incremented counter value exceeds the counter threshold X (Y), the counter value is reset to zero (K=0) in operation 530 and the boost time $T_B$ of the switching acceleration for the next turn-off switching operation is increased by a second adaptation time of a second predetermined amount (operation 520).

As a result, only one counter is incremented per switching operation. If the counter reaches a limit that can be set for the application, the boost time $T_B$ of the acceleration is increased for the following switching operation. If the limit value of the oscillation is exceeded in any switching operation, the boost time $T_B$ of the switching acceleration is immediately reduced for the following switching operation by operation 515 and the counter value is reset to zero in operation 540. This results in an optimal switching acceleration for the lowest occurring value of rapidly changing parameters. The modified method successfully compensates for the influence of slowly changing parameters on the boost time $T_B$ of the switching acceleration. In will also be appreciated that the counter threshold X is entirely configurable.

One of the advantages of the methods 500A and 500B is that no prior knowledge of the operation point vector is required. No variables such as DC link voltage, temperature, or switching current have to be measured. Only the time derivative switching current $di_D/dt$ is measured based on Ohm's Law ($di_D/dt=V\Delta/L$). Therefore, it is not necessary to create a detailed description or listing for the operation point vector dependency of the boost time $T_B$ of the switching acceleration. This saves development effort and necessary hardware implementation in the application.

In addition, the discretization of the target value for the boost time $T_B$ can be set as finely as desired within certain limits, so that there is an optimal match between the set duration and the duration of the switching acceleration required for the respective operation point vector. This ensures that the target value criterion is met for the lowest switching losses that can be achieved. It is also important that parameter fluctuations that are always present do not cause any problems, since they are always adapted to the respective situation.

In view of the above, the methods 500A and 500B enable a simple implementation of the cancellation of the target value conflict between the tendency to oscillate and the switching losses of SiC MOSFETs. It can be applied to possible realizations of a two-stage or multi-stage control of the SiC MOSFET.

While various embodiments have been disclosed, it will be apparent to those skilled in the art that various changes and modifications can be made which will achieve some of the advantages of the concepts disclosed herein without departing from the spirit and scope of the invention. For example, while is it noted that SiC MOSFETs generally switch so fast that oscillation is a recurring problem for SiC MOSFETs, embodiments may be applicable to any power semiconductor with a fast switching speed that encounters oscillation issues. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A gate driver system configured to drive a transistor between switching states in a power circuit, the gate driver system comprising:
   a gate driver circuit coupled to a gate terminal of the transistor and configured to control a gate voltage at the gate terminal in order to drive the transistor between the switching states, the gate driver circuit configured to generate an off-current during a plurality of turn-off switching events to turn off the transistor,
wherein the gate driver circuit includes a first driver configured to sink a first portion of the off-current from the gate terminal to discharge a first portion of the gate voltage,
wherein the gate driver circuit includes a second driver configured to, during a boost interval, sink a second portion of the off-current from the gate terminal to discharge a second portion of the gate voltage;
a measurement circuit configured to measure a transistor parameter indicative of an oscillation of a drain-source voltage of the transistor for a first turn-off switching event during which the transistor is transitioned to an off state; and
a controller configured to control the first driver to sink the first portion of the off-current and to control the second driver to sink the second portion of the off-current, wherein the controller is further configured to receive the measured transistor parameter and regulate a length of the boost interval based on the measured transistor parameter.

2. The gate driver system of claim 1, wherein the second driver is configured to activate a flow of the second portion of the off-current at a start of the boost interval for the length of the boost interval and deactivate the flow of the second portion of the off-current at an end of the boost interval to stop the flow of the second portion of the off-current.

3. The gate driver system of claim 1, wherein the transistor parameter is a time derivative of a drain current of the transistor.

4. The gate driver system of claim 3, wherein the controller is configured to compare the time derivative of the drain current to a threshold value to generate a comparison result, and regulate the length of the boost interval based on the comparison result.

5. The gate driver system of claim 4, wherein, during the first turn-off switching event, the controller is configured to compare the time derivative of the drain current to the threshold value to generate the comparison result.

6. The gate driver system of claim 4, wherein, during a predetermined monitoring interval following the boost interval, the controller is configured to compare the time derivative of the drain current to the threshold value for generating the comparison result.

7. The gate driver system of claim 6, wherein:
the controller is configured to detect an end of the boost interval and start the predetermined monitoring interval at the end of the boost interval, and
the comparison result indicates whether or not the time derivative of the drain current exceeded the threshold value during the predetermined monitoring interval.

8. The gate driver system of claim 4, wherein:
the controller is configured to initiate a comparison of the time derivative of the drain current to the threshold value at an end of the boost interval, and monitor the comparison for a predetermined monitoring interval following the boost interval, the comparison result indicating whether or not the time derivative of the drain current exceeds the threshold value at any point during the predetermined monitoring interval.

9. The gate driver system of claim 4, wherein:
the comparison result indicates whether or not the time derivative of the drain current exceeds the threshold value,
on a first condition that the time derivative of the drain current exceeds the threshold value, the controller is configured to decrease the length of the boost interval for a subsequent turn-off switching event, and
on a second condition that the time derivative of the drain current does not exceed the threshold value, the controller is configured to increase the length of the boost interval for the subsequent turn-off switching event.

10. The gate driver system of claim 4, wherein:
the comparison result indicates whether or not the time derivative of the drain current exceeds the threshold value,
on a first condition that the time derivative of the drain current exceeds the threshold value, the controller is configured to decrease the length of the boost interval for a subsequent turn-off switching event and reset a counter value to zero,
on a second condition that the time derivative of the drain current does not exceed the threshold value, the controller is configured to increment the counter value and compare the counter value to a predetermined counter threshold,
on a third condition that the second condition is satisfied and the counter value exceeds the predetermined counter threshold, the controller is configured to increase the length of the boost interval for the subsequent turn-off switching event and reset the counter value to zero, and
on a fourth condition that the second condition is satisfied and the counter value does not exceed the predetermined counter threshold, the controller is configured to maintain the length of the boost interval at its current value for the subsequent turn-off switching event.

11. The gate driver system of claim 3, wherein the measurement circuit comprises:
a comparator configured to measure a voltage difference across a stray inductance that is coupled in series to the transistor and through which the drain current flows, and
a processing circuit configured to convert the measured voltage difference to the time derivative of the drain current.

12. The gate driver system of claim 3, wherein the time derivative of the drain current corresponds to an operation point vector of the transistor that changes based on a load that is driven by the transistor.

13. The gate driver system of claim 1, wherein the measurement circuit comprises:
an RC circuit comprising a capacitor coupled in series with a resistor, wherein the RC circuit is coupled in parallel to the transistor;
a comparator configured to measure a voltage difference across the resistor, and
a processing circuit configured to convert the measured voltage difference to the transistor parameter.

14. The gate driver system of claim 1, wherein the measurement circuit comprises:
a voltage divider comprising a plurality of resistors, wherein the voltage divider circuit is coupled in parallel to the transistor;
a comparator configured to measure a voltage difference across a portion of the plurality of resistors, and
a processing circuit configured to convert the measured voltage difference to the transistor parameter.

15. The gate driver system of claim 1, wherein the second portion of the off-current is a boost off current that supplements the first portion of the off-current.

16. The gate driver system of claim 1, wherein the second portion of the off-current is larger than the first portion of the off-current.

17. The gate driver system of claim 1, wherein the first driver is configured to maintain the transistor in the off state until a turn-on switching event.

18. The gate driver system of claim 1, wherein the boost interval occurs during a portion of a transient interval of the gate voltage caused by the transistor transitioning from an on state to the off state.

19. The gate driver system of claim 18, wherein the first driver is configured to provide an on-current to the gate terminal during a plurality of turn-on switching events to turn on the transistor.

20. The gate driver system of claim 1, further comprising:
a first current path coupled between the gate terminal and the first driver through which the first portion of the off-current flows; and
a second current path coupled in parallel to the first current path between the gate terminal and the second driver through which the second portion of the off-current flows.

21. The gate driver system of claim 1, wherein the transistor is a silicon carbide (SiC) power transistor.

22. A method of driving a transistor between switching states in a power circuit, the method comprising:
generating an off-current during a plurality of turn-off switching events to control a gate voltage at a gate terminal of the transistor,
wherein generating the off-current includes sinking a first portion of the off-current from the gate terminal to discharge a first portion of the gate voltage, and sinking, during a boost interval, a second portion of the off-current from the gate terminal to discharge a second portion of the gate voltage;
measuring a transistor parameter indicative of an oscillation of a drain-source voltage of the transistor for a first turn-off switching event during which the transistor is transitioned to an off state;
activating the first portion of the off-current for a second turn-off switching event; and
activating the second portion of the off-current for the second turn-off switching event, including regulating a length of the boost interval based on the measured transistor parameter.

23. The method of claim 22, wherein a flow of the second portion of the off-current for the first turn-off switching event is initialized at a start of the boost interval and is deactivated at an end of the boost interval to stop the flow of the second portion of the off-current.

24. The method of claim 22, wherein the transistor parameter is a time derivative of a drain current of the transistor.

25. The method of claim 24, further comprising:
comparing the time derivative of the drain current to a threshold value to generate a comparison result; and
regulating the length of the boost interval for the second turn-off switching event based on the comparison result, the second turn-off switching event being subsequent to the first turn-off switching event.

26. The method of claim 25, wherein the comparison result indicates whether or not the time derivative of the drain current exceeds the threshold value, and the method further comprises:
on a first condition that the time derivative of the drain current exceeds the threshold value, decreasing the length of the boost interval for the second turn-off switching event, and
on a second condition that the time derivative of the drain current does not exceed the threshold value, increasing the length of the boost interval for the second turn-off switching event.

27. The method of claim 25, wherein the comparison result indicates whether or not the time derivative of the drain current exceeds the threshold value, and the method further comprises:
on a first condition that the time derivative of the drain current exceeds the threshold value, decreasing the length of the boost interval for the second turn-off switching event and reset a counter value to zero;
on a second condition that the time derivative of the drain current does not exceed the threshold value, incrementing the counter value and comparing the counter value to a predetermined counter threshold;
on a third condition that the second condition is satisfied and the counter value exceeds the predetermined counter threshold, increasing the length of the boost interval for the second turn-off switching event and resetting the counter value to zero; and
on a fourth condition that the second condition is satisfied and the counter value does not exceed the predetermined counter threshold, maintaining the length of the boost interval at its current value for the second turn-off switching event.

28. The method of claim 25, further comprising:
initiating a comparison of the time derivative of the drain current to the threshold value at an end of the boost interval; and
monitoring the comparison for a predetermined monitoring interval following the boost interval, the comparison result indicating whether or not the time derivative of the drain current exceeds the threshold value at any point during the predetermined monitoring interval.

* * * * *